(12) United States Patent
Kollenda et al.

(10) Patent No.: US 6,879,164 B2
(45) Date of Patent: Apr. 12, 2005

(54) METHOD AND DEVICE FOR INSULATION MONITORING OF A DC NETWORK

(75) Inventors: Gerald Kollenda, Geratshofen (DE); Hubert Urban, Ohmden (DE)

(73) Assignee: Ballard Power Systems AG, Kirchheim-Nabern (DE)

( * ) Notice: Subject to any disclaimer, the term of this patent is extended or adjusted under 35 U.S.C. 154(b) by 62 days.

(21) Appl. No.: 10/361,151

(22) Filed: Feb. 6, 2003

(65) Prior Publication Data

US 2003/0234653 A1 Dec. 25, 2003

(30) Foreign Application Priority Data

Feb. 9, 2002 (DE) .......................................... 102 05 381

(51) Int. Cl.⁷ ............................................... H04B 3/46
(52) U.S. Cl. ..................................... 324/551; 324/541
(58) Field of Search ............................... 324/551, 537, 324/500, 503, 509, 536, 544, 716, 541; 307/10.1; 340/647; 702/59

(56) References Cited

U.S. PATENT DOCUMENTS

| | | | | |
|---|---|---|---|---|
| 4,562,390 A | * | 12/1985 | Tobise ........................ | 318/490 |
| 4,766,387 A | * | 8/1988 | Browne et al. ............. | 324/545 |
| 4,896,115 A | * | 1/1990 | LeMaitre et al. ........... | 324/551 |
| 5,287,062 A | * | 2/1994 | Pellegrin et al. ............ | 324/551 |
| 5,303,164 A | * | 4/1994 | Masson et al. ............... | 702/65 |
| 5,495,908 A | * | 3/1996 | Obara et al. ............... | 180/65.8 |
| 5,652,521 A | * | 7/1997 | Meyer ........................ | 324/551 |
| 5,751,132 A | * | 5/1998 | Horvath et al. ............. | 318/798 |
| 5,818,236 A | * | 10/1998 | Sone et al. .................. | 324/509 |
| 6,114,775 A | * | 9/2000 | Chung et al. ............... | 307/10.1 |

FOREIGN PATENT DOCUMENTS

| | | | | |
|---|---|---|---|---|
| DE | | 2051835 | 4/1972 | |
| DE | | 4339946 A1 | 6/1995 | |
| DE | | 10106200 C | * 9/2002 | ........... G01R/27/18 |

OTHER PUBLICATIONS

U.S. Appl. No. 10/375,927, filed Feb. 26, 2003, inventor Beutelschiess et al.

* cited by examiner

*Primary Examiner*—N. Le
*Assistant Examiner*—Hoai-An D. Nguyen
(74) *Attorney, Agent, or Firm*—Seed IP Law Group PLLC

(57) ABSTRACT

A method and device for insulation monitoring of an electrically insulated DC network by measuring of the insulation resistance using galvanic isolation between a measuring resistor which is connected to ground, and a measuring pulse generator, and a measurement-data acquisition device, which eliminates some of the effect that noise in the DC network would otherwise have on the measurement.

34 Claims, 2 Drawing Sheets

METHOD AND DEVICE FOR INSULATION MONITORING OF A DC NETWORK

BACKGROUND OF THE INVENTION

1. Field of the Invention

This invention is generally related to monitoring insulation of an electrically insulated DC network.

2. Description of the Related Art

DE 43 39 946 A1 is generally directed to a method and a device for monitoring insulation. The patent discloses a measuring resistor connected directly to the inputs of an analog-digital converter of a microcontroller via an active rectifier circuit, and a sample-and-hold circuit with a measuring amplifier. The DC noise (e.g., overvoltages or undervoltages) in the DC network directly affects the inputs of the analog-digital converter, adversely affecting the measuring accuracy.

DE 20 51 835 C2 is generally directed to a device for insulation monitoring of ungrounded DC networks. The device has a primary winding that can be alternatively connected between the two network terminals and ground, a secondary winding that is electrically isolated from the primary winding and which is connected to an evaluation circuit, and a compensating winding used to compensate for network voltage fluctuations.

BRIEF SUMMARY OF THE INVENTION

It is desirable to have a method and apparatus capable of monitoring the insulation of electrically insulated or grounded DC networks that shows a low sensitivity to interference from the network's DC voltage, such as overvoltages or undervoltages.

In one aspect, a method of insulation monitoring of an electrically insulated DC network, includes from time-to-time, producing a measuring pulse in the DC network; at a defined duration after producing the measuring pulse, determining a potential of each terminal of a measuring resistor; and from time-to-time, determining changes in the determined potentials of each terminal of the measuring resistor from respective previous determined potentials of the terminals of the measuring resistor. The defined duration based on a charging time for a capacitive insulation resistance of the network. The method may further include one or more of: determining a moving average of an insulation resistance using the determined changes in the determined potentials; multiplying the determined moving average by a factor less than unity; comparing a product of the multiplication to a permissible value; and operating a contactor switch between the load and the power source based on the comparison.

In another aspect, an apparatus to monitor insulation of an electrically insulated DC network, the network capable of supplying power to at least one load from at least one source, includes means for producing a measuring pulse in the DC network from time-to-time; means for determining a potential of each terminal of a measuring resistor at a defined duration after producing the measuring pulse; and means for determining changes in the determined potentials of each terminal of the measuring resistor from respective previous determined potentials of the terminals of the measuring resistor from time-to-time.

In yet another aspect, an apparatus for insulation monitoring of an electrically insulated DC network, the network capable of selectively coupling at least one load to at least one power source, includes: a ground; a voltage source to produce measuring pulses; a measuring resistor having a first terminal and a second terminal; the measuring resistor electrically coupled between the ground and the voltage source to receive measuring pulses from the voltage source from time-to-time; and a controller coupled to receive signals representative of a potential on each of the terminals of the measuring resistor at least a defined duration after each of the measuring pulses wherein the defined duration approximately matches a charging time for a capacitive insulation resistance of the network. The apparatus may also include one or more of: a change over switch electrically coupled between the measuring resistor and the voltage source and selectively operable to alternate a polarity of successive ones of the measuring pulses provided to the measuring resistor from the voltage source. The controller may be configured to do one or more of: determine changes in the potentials of each of the terminals of the measuring resistor from respective previous potentials of the terminals of the measuring resistor, from time-to-time; determine a moving average of insulation resistance based on the determined changes; multiple the moving averages by a factor less than unity; and compare a product of the multiplication with a permissible value; and selectively operate a switch to couple and uncouple the load from the power source based on the comparison.

In still another aspect, an apparatus for insulation monitoring of an electrically insulated DC network, the network capable of selectively coupling at least one load to at least one power source, includes: a ground; a voltage source to produce measuring pulses; a measuring resistor having a first terminal and a second terminal; the measuring resistor electrically coupled between the ground and the voltage source to receive measuring pulses from the voltage source from time-to-time; and a controller coupled to receive signals representative of a potential on each of the terminals of the measuring resistor at least a defined duration after each of the measuring pulses wherein the controller is configured to determine changes in the potentials of each of the terminals of the measuring resistor from respective previous potentials of the terminals of the measuring resistor, from time-to-time, and to determine a moving average of insulation resistance based on the determined changes.

In yet still another aspect, an apparatus for insulation monitoring of an electrically insulated DC network, the network capable of selectively coupling at least one load to at least one power source, includes: a ground; a voltage source to produce measuring pulses; a measuring resistor having a first terminal and a second terminal; the measuring resistor electrically coupled between the ground and the voltage source to receive measuring pulses from the voltage source from time-to-time; a controller coupled to receive signals representative of a potential on each of the terminals of the measuring resistor at least a defined duration after each of the measuring pulses; and at least one high pass filter, electrically coupled between one of the terminals of the measuring resistor and the controller. The apparatus may also include at least one low pass filter.

In a further aspect, a controller is monitored by a watchdog arrangement and on its output side is connected to an isolation switch or disconnect switch, which is arranged between the output of the DC voltage source and the DC network and which is opened or kept open if the insulation resistance falls below a pre-selectable limiting value and or if the watchdog arrangement is triggered as a result of a malfunction of the controller.

In yet a further aspect, the DC network may be located in a mobile device, which possesses at least one motor that is supplied by an inverter. In particular, the DC voltage source may be a fuel cell.

In the following, the invention will be described in more detail with the help of embodiment examples that are illustrated in the figures and that show further details, features, and advantages.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION OF THE INVENTION

Figure 1:
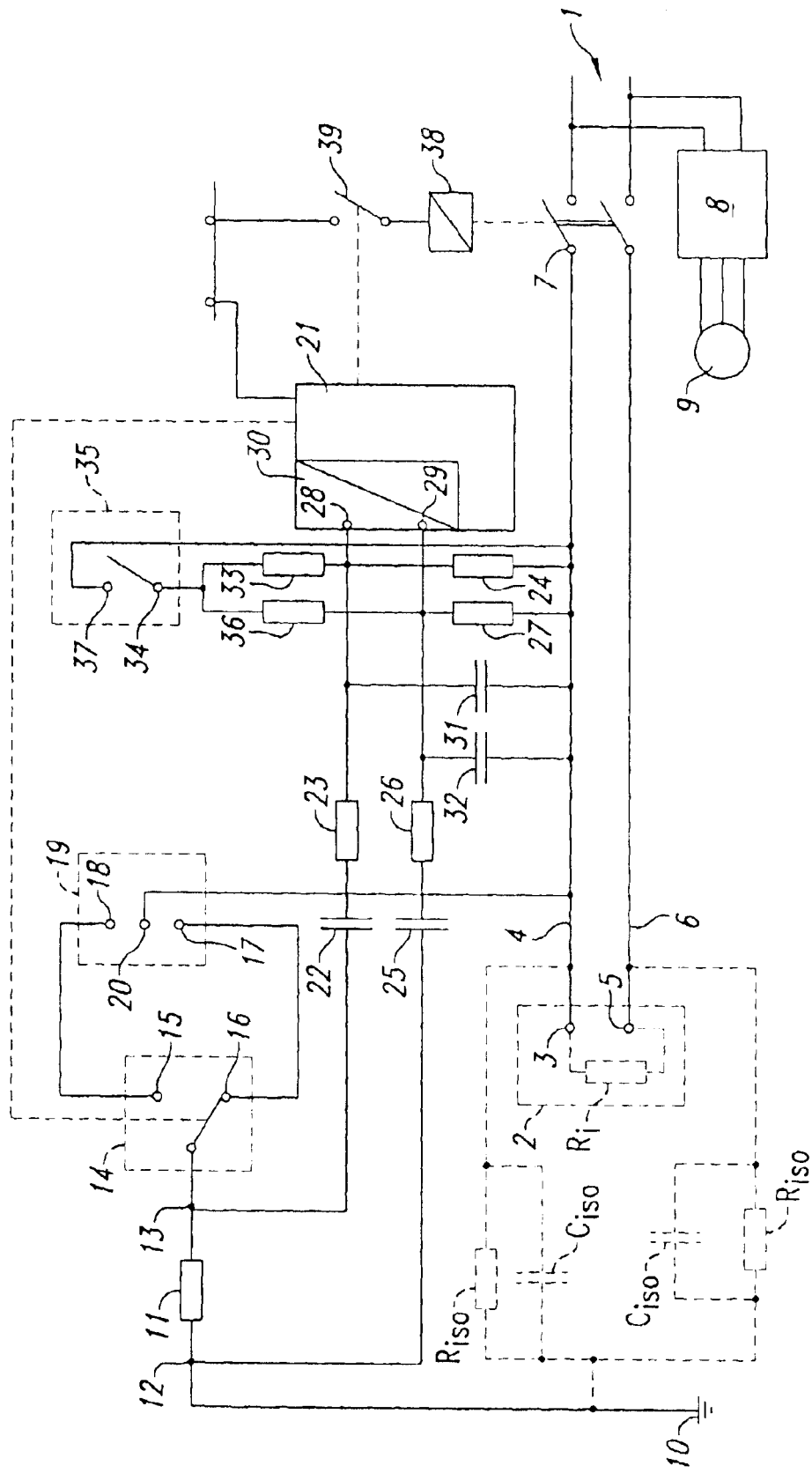
FIG. 1 shows a schematic circuit diagram of a device for insulation monitoring of an electrically insulated DC network.

In the following description, certain specific details are set forth in order to provide a through understanding of various embodiments of the invention. However, one skilled in the art will understand that the invention may be practiced without these details. In other instances, well-known structures associated with analog to digital (A/D) converters, filters, fuel cell stacks, controllers (e.g., microprocessors, microcontrollers) and inverters have not been shown or described in detail to avoid unnecessarily obscuring descriptions of the embodiments of the invention.

Unless the context requires otherwise, throughout the specification and claims which follow, the word "comprise" and variations thereof, such as, "comprises" and "comprising" are to be construed in an open, inclusive sense, that is as "including, but not limited to."

The headings provided herein are for convenience only and do not interpret the scope or meaning of the claimed invention.

A DC network 1 contains a DC source 2, for example a fuel cell stack, that is connected with one terminal 3 to a line or contact rail 4 of the DC network 1 and is connected with the other terminal 5 to a line or contact rail 6 of the DC network 1. The terminal 3 may, for example, be at a negative potential while the terminal 5 is at a positive potential, but the potentials of the terminals 3, 5 may also be reversed. The lines 4, 6 are also commonly referred to as terminals of the DC network.

Downstream of the terminals 3, 5, a contactor, isolation switch, or disconnect switch 7 is provided in the lines 4, 6. One or more loads are connected to the DC network 1 downstream of the isolation switch or disconnect switch 7. FIG. 1 shows only one load, in the form of an inverter 8 supplying an electric motor 9. The DC network 1 with the DC source 2 and the loads, as well as, an arrangement for insulation monitoring, may be located in a mobile device, e.g., in an electric or hybrid vehicle. The device has metallic parts that are connected in an electrically conducting manner, and which must not be electrically active during the operation of the device and are thus referred to as ground. The DC network 1 is insulated with respect to this ground. In stationary, permanently installed DC networks, this ground corresponds to earth. For this reason, the DC network 1 can also be called "un-earthed." In FIG. 1, the ground is labelled 10.

The insulation monitoring device includes a measuring resistor 11, which is connected with one terminal lead 12 to ground 10 and with the other terminal lead 13 to the output of a change-over switch 14, which possesses two inputs 15, 16, of which the input 15 is connected to an output 18 of a voltage source 19, while the other input 16 is connected to the output 17 of the voltage source 19, which generates a positive potential at the output 17 and a negative potential at the output 18. These potentials are measured with respect to the potential of the line 4, to which is connected an output 20 of the voltage source 19. This output 20 is also referred to as output for the reference potential. The terminals 3, 5 and the lines 4, 6 or terminals of the DC network 1 are equivalent in terms of the connection to the insulation monitoring device. The change-over switch 14 is periodically actuated, for example by a controller 21 such as a microprocessor or a microcontroller, so that positive and negative pulses—hereafter also referred to as measuring pulses—will alternate at the output of the change-over switch 14. It is also possible to employ an AC pulse voltage source, which alternates between outputting a measuring voltage with positive level and zero potential and a voltage with negative level and zero potential.

Thus, the voltage source 19 and the change-over switch 14, which is controlled by the controller 21, form an AC pulse voltage source with a reference voltage output 20 and with inputs that may be electrically isolated from the terminals 3, 5 or lines 4, 6. Connected to the terminal lead 13 of the measuring resistor 11 is a capacitor 22, which is also—via a resistor 23—connected to a resistor 24, the second terminal lead of which is connected to the line 4 or the terminal 3. In a corresponding manner, the terminal lead 12 is connected to a capacitor 25 that is connected in series with a resistor 26, to which is connected a second resistor 27, the second terminal lead of which is connected to the line 4. The terminal leads of the resistors 24, 27 on the side opposite to the line 4 are connected to the respective inputs 28, 29 of an analog-digital converter 30, which is connected with the controller 21, which serves as a measurement data acquisition device. Alternatively, the A/D converter functionality may be integrated into the controller 21. The capacitor 22 and the resistors 23, 24, and 33 form a capacitive high pass filter. In a corresponding manner, the capacitor 25 and the resistors 26, 27, and 36 form a further high pass filter.

The high pass filters ensure that noise in the system's DC voltage cannot reach the measurement-data acquisition device. For this reason, the measuring range of the measurement-data acquisition device can be adjusted to the magnitude of the AC pulse voltage, which results in less complexity of the measurement-data acquisition device. Furthermore, it becomes possible to dimension the AC pulse voltage significantly smaller—compared to the magnitude of the network DC voltage, without any negative effects on the measuring accuracy. This also helps to simplify the measuring technique. Since the internal resistance of the DC voltage source is much smaller than the value of the measuring resistor, and thus is practically negligible, the described method and apparatus are able to detect both faults to earth, as well as faults to chassis ground, between the positive and negative network lines or network terminals.

The time period between measuring pulses may be set to be smaller than the respective time constants of the high pass filters. For this reason, there is a sufficient amount of time available to carry out several measurements—separated by time intervals—of the voltages at the measuring resistor in between two AC pulse voltages, which are for example square-wave pulses with both positive and negative polarity or square-wave pulses with only one polarity that are separated by time intervals of zero voltage level. For example, ten measuring values may be detected between two successive measuring pulse voltages, e.g., successive pulses of opposite polarity. This provides an adequate number of measuring values for the averaging.

A capacitor 31 is connected in parallel to the resistor 24. The resistor 23 and the capacitor 31 form a low pass filter. In a corresponding manner, a low pass filter is formed by the resistor 26 and a capacitor 32, which is connected in parallel to the resistor 27.

The low pass filters possess a cut-off frequency, that is matched to the lower limit of the working frequency of the at least one inverter that is supplied by the DC network. An advantage inherent in this arrangement is that the measurement-data acquisition device is protected against noise, which in the event of a fault to earth or fault to ground of a phase downstream of the output of the inverter could lead to AC voltages in the DC network.

The dimensioning of the above-described high pass and low pass filters is identical.

A bias voltage is produced at the input 28 by a voltage divider, which is formed by the resistor 24 and a further resistor 33, which is connected to an output 34 of a voltage source 35. In a corresponding manner, a bias voltage is produced at the input 29 by a voltage divider, which is formed by the resistor 27 and a further resistor 36, which is connected to the output 34. The second terminal 37 of the voltage source 35 is connected to the line 4. The voltage source 35 typically is the reference voltage source of the analog-digital converter 30.

One output of the controller 21 is connected to a relay or power output stage 39. The coil 38 of the contactor, isolation switch, or disconnect switch 7 is connected to the relay or power output stage 39.

If required, the analog-digital converter 30 and the controller 21 can be coupled via a galvanic isolation point, e.g., an opto-coupler. The controller 21 and the voltage source 35 may be supplied by the same voltage supply.

The internal resistance $R_i$ of the DC source 2 is illustrated with dashed lines. The ohmic insulation resistance between the line 4 and the conducting elements of the DC network connected to the line is labelled as $R_{iso}$ and is symbolically shown in the figure by dashed lines. The capacitive insulation resistance between the line 4 and the conducting elements of the DC network that are connected to the line is labelled as $C_{iso}$ and is symbolically shown by dashed lines. The ohmic insulation resistance $R_{iso}$ and the capacitive insulation resistance $C_{iso}$ of the line 6 and the conducting network components connected to the line are assumed to be equal to the respective resistances above.

The time constants of the high pass filters are larger than the time intervals or time durations between two consecutive measuring pulses, the polarities of which alternate between positive and negative.

The controller 21 is monitored by a watchdog arrangement. Watchdog arrangements are generally known in the computing arts, and refer to the checking from time-to-time of some variable, status or condition, and taking of some action if the variable, status or condition does not meet some defined threshold. Thus, a watchdog arrangement typically performs a specific operation after a certain period of time, typically to prevent the occurrence of some condition if something goes wrong the system.

After the start of each of the measuring pulses that are applied to the measuring resistor 11, a time delay is initiated in the controller 21, whereby the duration of the time delay is coordinated with the charging of the capacitive insulation resistance $C_{iso}$. The charge time that is valid for the DC network 1 and the connected loads can be determined by a measurement and can be stored in advance. After the end of the delay time, the voltages at the terminal leads 12 and 13 of the measuring resistor 11, which in the following will be referred to as $V_O$ and $V_M$, are periodically measured simultaneously or with a very small time offset, i.e., practically simultaneously, by using the voltage components present at the inputs 28, 29, and are subsequently stored. As used herein, the term "simultaneously" means a short period of time during which the voltage change at the measuring resistor is negligible for practical purposes. The differences $\Delta V_M$ and $\Delta V_O$ are formed of two successive measurements of each of the voltages $V_M$ and $V_O$, respectively.

The capacitance of the capacitors 22, 25 and the resistors 23, 26 and 24, 27, and 33, 36 are chosen so that the voltages $V_M$ and $V_O$ that are at the inputs 28, 29 are suitably scaled for the analog-digital converter 30.

The controller 21 uses the differences $\Delta V_M$ and $\Delta V_O$ to calculate the moving average of the insulation resistance $R_{ins}$ by consecutively generating the arithmetic mean according to the following equation:

$$R_{ins} = R_M * \frac{1}{\frac{\Delta V_O}{\Delta V_M} - 1}.$$

The insulation resistance $R_{ins}$ that is obtained by calculating the moving average is then multiplied by a factor<1. This fraction takes into account tolerances of the components of the measuring circuit and the voltage drops at the capacitors 22, 25 and the resistors 23, 26, 24, 27, 33, and 36.

Obtaining this fraction of the calculated value $R_{ins}$ ensures that the value of the resistance that is calculated in the averaging is always lower than the actual value of the insulation resistance. This procedure provides for a margin of error since the insulation resistance must not fall below a certain value in order to prevent endangerment of personnel and equipment.

The smaller value obtained from the value $R_{ins}$ is used as a comparison value in the controller 21 and is compared to a permissible value. If the value falls below the permissible value, the controller 21 opens the contactor, isolation switch, or disconnect switch 7, or, if the contactor, isolation switch, or disconnect switch 7 is already open, prevents it from being closed. The disconnection of the DC network prevents any endangerment of personnel and equipment, which could arise as a result of a terminal's fault to earth or fault to chassis ground, when earth or ground are shorted to the other terminal. In addition, an alarm may be given to alert personnel of the malfunction.

The measurement-data acquisition device is equipped with an analog-digital converter 30, which is connected to the controller 21, whereby the controller 21 is monitored by a watchdog arrangement. Watchdog arrangements are common in the computing arts, and involves the checking of a variable, states or condition from time-to-time and the automatic termination of a function or process unless the variable, states or condition satisfies some threshold. Since a malfunction of the controller can lead to the generation of faulty values or no values, in order to avert any danger, the DC network will be de-energized if a malfunction is detected in the controller. The watchdog detects any faulty operation or any breakdown of the operational mode of the controller 21, and as a result of such an event initiates the opening of the contactor, isolation switch, or disconnect switch 7, or, if the latter is already open, prevents it from being closed. In addition, an optical and/or acoustical alarm signal may be generated.

In the above-described device, variations of the DC voltage in the DC network 1 will have no detrimental effect on the measuring accuracy or the resolution. The measuring range of the analog-digital converter 30 may be tuned to the voltage range of the DC voltage source 19. The voltage range of the DC voltage source 19 may be comparatively small, i.e., in a range between 15 and 30 V. Due to the high degree of isolation from the noise of the DC network 1, the analog-digital converter 30 only has to be designed for small additional interference voltages (overload margin).

Interference voltages arising due to a short circuit fault of a phase of the inverter to ground, will be attenuated by the low pass filters to such a degree that they can not overload the analog-digital converter 30. The cut-off frequency of the low pass filters is chosen so that it is lower than the lowest inverter frequency of the current converter 8. Lower-frequency noise voltages will be eliminated from the measured values by the averaging.

The value of the insulation resistance is determined by the controller 21, for example with the help of software or firmware. If the voltage values that are detected by the analog-digital converter 30 change periodically due to the switching of the polarity, then the software will be able to detect a fault in the hardware of the voltage measuring device. The software is monitored by the watchdog arrangement.

In accordance with VDE standards, the time interval allowed for a response to an insulation fault, i.e., if the insulation value falls below a permissible limit, is comparatively long, e.g., <100 sec. Consequently, if the watchdog is triggered, the isolation switch or disconnect switch 7 can definitely be opened.

Preferably, the voltage sources 19 and 35 are DC/DC converters that are supplied by an auxiliary power network. The voltage of the voltage source 35 may be small compared to the voltage of the network 1, e.g., 5V. The voltage of the voltage source 19 is also significantly lower than the voltage of the network 1 and may be the voltage of a vehicle network with 12V or may be in a range between 15 to 30 V.

On principle, the insulation monitoring can be implemented with a device in which the measuring resistor 11, the change-over switch 14, and the pulse AC voltage source are arranged in series between the ground 10 and one of the terminals 3, 4 or 5, 6. In this case, the resistors of the high pass filters are connected to the one of the outputs 20 of the pulse AC voltage source that is a connection point of the series connection, the other connection point of which is the one end of the measuring resistor 11.

Figure 2:
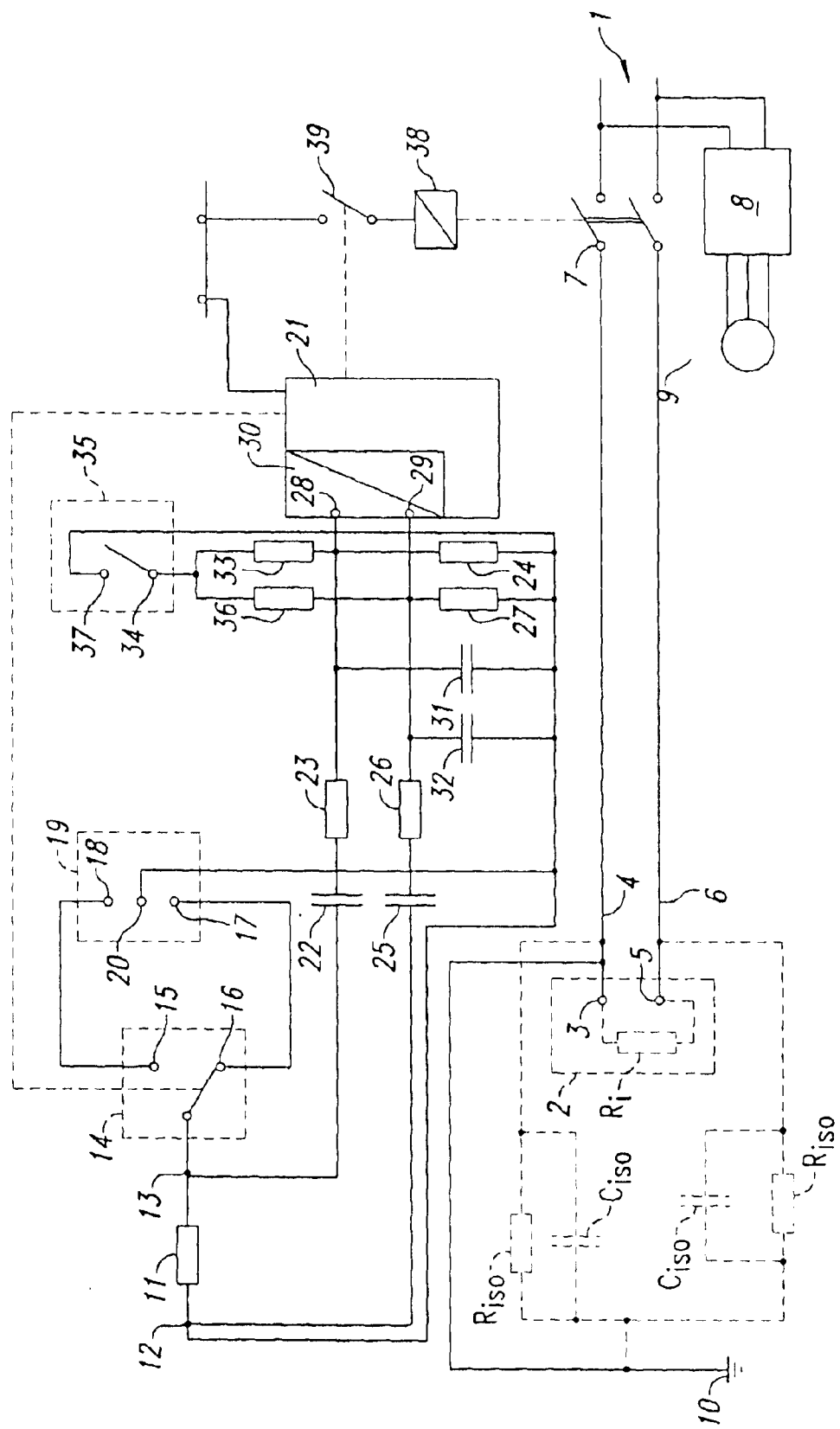
FIG. 2 shows a schematic circuit diagram of a second embodiment of a device for insulation monitoring of an electrically insulated DC network.

FIG. 2 shows a second embodiment of an arrangement for insulation monitoring of an electrically insulated DC network that is designed in accordance with the above-mentioned principles. In the device according to FIG. 2, the one terminal lead 12 of the measuring resistor 11 is connected with a terminal 3 of the fuel cell or the terminal 4 of the DC network 1. The terminal 20 of the AC pulse voltage source, together with the terminal leads of the resistors 24, 27 and of the capacitors 31, 32, is connected to ground 10. The other terminal leads of the capacitors 31, 32 and the resistors 24, 27 are connected to the inputs of the analog-digital converter 30. One of the terminals of the voltage source 35 is also connected to ground 10.

It is also possible for the change-over switch 14 to be periodically changed over by a clock generator, which is not shown. This change-over is signalled to an input of the microcontroller 21, which results in the controller carrying out the measuring and calculation of the insulation resistance in the above-described manner.

All of the above U.S. patents, U.S. patent application publications, U.S. patent applications, foreign patents, foreign patent applications and non-patent publications referred to in this specification and/or listed in the Application Data Sheet, including but not limited to German Patent Application No. 10205381.2, filed Feb. 6, 2002, are incorporated herein by reference, in their entirety.

The described methods and apparatus are particularly well-suited for the monitoring of the insulation resistance of a DC network that is supplied by a fuel cell, for example with a nominal voltage in the range of 200–400 V, in a mobile device, for example a vehicle or a boat. From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of insulation monitoring of an electrically insulated DC network, the network capable of selectively coupling at least one load to at least one power source, the method comprising:
    from time-to-time, producing a measuring pulse in the DC network;
    at least one defined duration after producing the measuring pulse, determining a potential of each terminal of a measuring resistor; and
    from time-to-time, determining changes in the determined potentials of each terminal of the measuring resistor from respective previous determined potentials of the terminals of the measuring resistor.

2. The method of claim 1, further comprising:
    determining the defined duration based on a charging time for a capacitive insulation resistance of the network.

3. The method of claim 1, further comprising:
    high pass filtering the potentials of each terminal of the measuring resistor before determining the potentials.

4. The method of claim 1, further comprising:
    determining a moving average of an insulation resistance using the determined changes in the determined potentials.

5. The method of claim 1, further comprising:
    determining a moving average of an insulation resistance using the determined changes in the determined potentials according to relation:

$$R_{ins} = R_M * \frac{1}{\frac{\Delta V_O}{\Delta V_M} - 1},$$

where $R_{ins}$ is the insulation resistance, $R_M$ is the resistance of the measuring resistor, $\Delta V_O$ is the difference between successive determined potentials at one of the terminal leads of the measuring resistance, $\Delta V_M$ is the difference between successive determined potentials at the other of the terminal leads of the measuring resistance.

6. The method of claim 5, further comprising:

multiplying the determined moving average by a factor less than unity;

comparing a product of the multiplication to a permissible value; and operating a contactor switch between the load and the power source based on the comparison.

7. The method of claim 1 wherein from time-to-time, producing a measuring pulse in the DC network includes alternating successive ones of the measuring pulses between a positive and a negative polarity.

8. The method of claim 1, further comprising:

opening a contactor to disconnect the load from the power source.

9. The method of claim 1, further comprising:

from time-to-time, determining an operational status of a controller, and operating a contactor to disconnect the load if the operational status matches a failure condition.

10. The method of claim 1 wherein from time-to-time, producing a measuring pulse in the DC network includes producing the measuring pulses at an interval less than a respective time constant of at least one high pass filter in the network.

11. The method of claim 1 wherein determining a potential of each terminal of a measuring resistor is repeated at least ten times between producing each measuring pulse.

12. An apparatus to monitor insulation of an electrically insulated DC network, the network capable of supplying power to at least one load from at least one source, the apparatus comprising:

means for producing a measuring pulse in the DC network from time-to-time;

means for filtering a potential of each terminal of a measuring resistor at a defined duration after producing the measuring pulse; and means for determining the potential of each terminal of a measuring resistor at a defined duration after producing the measuring pulse; and means for determining changes in the determined potentials of each terminal of the measuring resistor from respective previous determined potentials of the terminals of the measuring resistor from time-to-time.

13. The apparatus of claim 12 wherein the means for determining the potential of each terminal of a measuring resistor at a defined duration after producing the measuring pulse comprises means for delaying the determination for a period approximately matching a charging time for a capacitive insulation resistance of the network.

14. The apparatus of claim 12, further comprising:

high pass filtering means for filtering a potential on each terminal of the measuring resistor.

15. The apparatus of claim 12, further comprising:

means for determining a moving average of an insulation resistance using the determined changes in the determined potentials according to relation:

$$R_{ins} = R_M * \frac{1}{\frac{\Delta V_O}{\Delta V_M} - 1},$$

where $R_{ins}$ is the insulation resistance, $R_M$ is the resistance of the measuring resistor, $\Delta V_O$ is the difference between successive determined potentials at one of the terminal leads of the measuring resistance, $\Delta V_M$ is the difference between successive determined potentials at the other of the terminal leads of the measuring resistance;

means for multiplying the moving average by a factor less than unity;

means for comparing a product of the multiplication to a permissible value; and means for disconnecting the load from the power source based on the comparison.

16. An apparatus for insulation monitoring of an electrically insulated DC network, the network capable of selectively coupling at least one load to at least one power source, the apparatus comprising:

a ground;

a voltage source to produce measuring pulses;

a measuring resistor having a first terminal and a second terminal, the measuring resistor electrically coupled between the ground and the voltage source to receive measuring pulses from the voltage source from time-to-time; and a controller coupled to detect signals representative of a potential on each of the terminals of the measuring resistor at least a defined duration after each of the measuring pulses wherein the defined duration approximately matches a charging time for a capacitive insulation resistance of the network.

17. The apparatus of claim 16, further comprising:

a change over switch electrically coupled between the measuring resistor and the voltage source and selectively operable to alternate a polarity of successive ones of the measuring pulses provided to the measuring resistor from the voltage source.

18. The apparatus of claim 16, further comprising:

a change over switch electrically coupled between the measuring resistor and the voltage source and selectively operable to alternate between measuring pulses with one polarity and measuring pulses at zero potential.

19. The apparatus of claim 16 wherein the controller is configured to determine changes in the potentials of each of the terminals of the measuring resistor from respective previous potentials of the terminals of the measuring resistor, from time-to-time.

20. The apparatus of claim 16, further comprising:

an analog-digital converter electrically coupled between the measuring resistor and the controller to convert analog potentials to digital signals representative of the potential on each of the terminals of the measuring resistor.

21. The apparatus of claim 16, further comprising:

a watchdog circuit configured to determine an operational status of a controller, and selectively operate a contactor to disconnect the load from the power source if the operational status matches a failure condition.

22. The apparatus of claim 16, further comprising:

at least one of a contactor, an isolation switch, and a disconnect switch selectively operable via the controller to couple and uncouple the load from the power source via the network.

23. The apparatus of claim 16 wherein a reference potential of the voltage source is electrically coupled to the ground.

24. The apparatus of claim 16 wherein load is an electric traction motor and the network is coupled to electric traction motor via an inverter.

25. The apparatus of claim 16, further comprising:
a reference voltage source electrically coupled between the controller and the measuring resistor, wherein the voltage source and the reference voltage source are formed as DC/DC converters that are electrically isolated from the network and are supplied by a separate DC voltage network located in a mobile device.

26. An apparatus for insulation monitoring of an electrically insulated DC network, the network capable of selectively coupling at least one load to at least one power source, the apparatus comprising:
a ground;
a voltage source to produce measuring pulses;
a measuring resistor having a first terminal and a second terminal, the measuring resistor electrically coupled between the ground and the voltage source to receive measuring pulses from the voltage source from time-to-time; and
a controller coupled to detect signals representative of a potential on each of the terminals of the measuring resistor at least a defined duration after each of the measuring pulses wherein the controller is configured to determine changes in the potentials of each of the terminals of the measuring resistor from respective previous potentials of the terminals of the measuring resistor, from time-to-time, and to determine a moving average of insulation resistance based on the determined changes.

27. The apparatus of claim 26 wherein the defined duration approximately matches a charging time for a capacitive insulation resistance of the network.

28. The apparatus of claim 26 wherein the controller is further configured to: multiple the moving averages by a factor less than unity, compare a product of the multiplication with a permissible value, and selectively operate a switch to couple and uncouple the load from the power source based on the comparison.

29. The apparatus of claim 26 wherein the ground comprises a chassis of an electric vehicle.

30. An apparatus for insulation monitoring of an electrically insulated DC network, the network capable of selectively coupling at least one load to at least one power source, the apparatus comprising:
a ground;
a voltage source to produce measuring pulses;
a measuring resistor having a first terminal and a second terminal, the measuring resistor electrically coupled between the ground and the voltage source to receive measuring pulses from the voltage source from time-to-time;
a controller coupled to detect signals representative of a potential on each of the terminals of the measuring resistor at least a defined duration after each of the measuring pulses wherein the defined duration approximately matches a charging time for a capacitive insulation resistance of the network; and
at least one high pass filter, electrically coupled between one of the terminals of the measuring resistor and the controller.

31. The apparatus of claim 30 wherein the at least one high pass filter has a time constant greater than or equal to an interval between successive ones of the measuring pulses.

32. The apparatus of claim 30 wherein the at least one high pass filter comprises:
a first high pass filter, electrically coupled between one of the terminals of the measuring resistor and the controller; and
a second high pass filter, electrically coupled between the other of the terminals of the measuring resistor and the controller.

33. The apparatus of claim 30, further comprising:
a first low pass filter, electrically coupled between one of the terminals of the measuring resistor and the controller; and
a second low pass filter, electrically coupled between the other of the terminals of the measuring resistor and the controller.

34. The apparatus of claim 30, further comprising:
a first low pass filter, electrically coupled between one of the terminals of the measuring resistor and the controller; and
a second low pass filter, electrically coupled between the other of the terminals of the measuring resistor and the controller, wherein the load comprises an inverter and each of the low pass filters has a cut-off frequency that is matched to a lower limit of working frequencies of the inverter.

* * * * *

UNITED STATES PATENT AND TRADEMARK OFFICE
CERTIFICATE OF CORRECTION

PATENT NO. : 6,879,164 B2
DATED : April 12, 2005
INVENTOR(S) : Gerald Kollenda et al.

It is certified that error appears in the above-identified patent and that said Letters Patent is hereby corrected as shown below:

<u>Title page,</u>
Item [30], Foreign Application Priority Data, "Feb. 9, 2002 (DE) 10205381" should read as -- Feb. 6, 2002 (DE) 10205381 --.

Signed and Sealed this

Twenty-seventh Day of September, 2005

JON W. DUDAS
*Director of the United States Patent and Trademark Office*

UNITED STATES PATENT AND TRADEMARK OFFICE
CERTIFICATE OF CORRECTION

PATENT NO. : 6,879,164 B2  Page 1 of 1
DATED : April 12, 2005
INVENTOR(S) : Kollenda, Gerald It is certified that error appears in the above-identified patent and that said Letters Patent is hereby corrected as shown below:

Title page,
Item [30], Foreign Application Data, delete
"Feb. 6, 2002    (DE)…………………..10205381" and insert
-- Feb. 9, 2002    (DE)…………………..10205381 --.

Signed and Sealed this

Eighteenth Day of April, 2006

JON W. DUDAS
*Director of the United States Patent and Trademark Office*